United States Patent
Stapleton et al.

(10) Patent No.: US 10,153,773 B2
(45) Date of Patent: Dec. 11, 2018

(54) LOW-POWER OSCILLATOR

(71) Applicant: Nordic Semiconductor ASA, Trondheim (NO)

(72) Inventors: Joel Stapleton, Trondheim (FI); Martin Tverdal, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 211 days.

(21) Appl. No.: 15/107,833

(22) PCT Filed: Dec. 10, 2014

(86) PCT No.: PCT/GB2014/053650
§ 371 (c)(1),
(2) Date: Jun. 23, 2016

(87) PCT Pub. No.: WO2015/097430
PCT Pub. Date: Jul. 2, 2015

(65) Prior Publication Data
US 2016/0322978 A1 Nov. 3, 2016

(30) Foreign Application Priority Data
Dec. 24, 2013 (GB) .................................. 1322978.6

(51) Int. Cl.
*H03L 1/02* (2006.01)
(52) U.S. Cl.
CPC ................ *H03L 1/026* (2013.01); *H03L 1/02* (2013.01); *H03L 1/025* (2013.01)

(58) Field of Classification Search
CPC . H03L 1/02; H03L 1/026; H03L 1/025; G06F 1/04; G06F 1/06
See application file for complete search history.

(56) References Cited

U.S. PATENT DOCUMENTS 5,831,485 A * 11/1998 Nelson ................. G01R 15/125
331/158
8,301,181 B2 10/2012 Mullen
9,252,779 B2 * 2/2016 Iwasa ....................... H03B 5/04
(Continued)

FOREIGN PATENT DOCUMENTS

EP    2 439 846 A1    4/2012
GB    2488013 A    8/2012
(Continued)

OTHER PUBLICATIONS

Search Report Under Section 17(5) for GB1322978.6, dated Jun. 17, 2014, 3 pages.
(Continued)

*Primary Examiner* — Ryan Johnson
(74) *Attorney, Agent, or Firm* — Klarquist Sparkman, LLP

(57) ABSTRACT

A method of calibrating a first oscillator (102) is disclosed. A temperature is measured to obtain a measured temperature value and a determination is made of whether said measured temperature value differs from at least one previously measured temperature value by more than a threshold amount. If said measured temperature does differ from at least one previously measured temperature by more than said threshold amount, a reference oscillator (108, 110) is used to calibrate the first oscillator (102).

30 Claims, 8 Drawing Sheets

(56) References Cited

U.S. PATENT DOCUMENTS

2006/0223454 A1* 10/2006 Westwick ................ H03L 1/00
                                                                  455/76
2007/0176705 A1    8/2007  Sutardja
2010/0277246 A1   11/2010  Seth et al.
2015/0207515 A1    7/2015  Bruset et al.

FOREIGN PATENT DOCUMENTS

WO    WO98/34123 A1    8/1998
WO    WO2006/138499 A1  12/2006

OTHER PUBLICATIONS

International Search Report and Written Opinion for PCT/GB2014/053650, dated Feb. 20, 2015, 11 pages.
International Preliminary Report on Patentability and Written Opinion for PCT/GB2014/05365, dated Jun. 28, 2016, 8 pages.

* cited by examiner

LOW-POWER OSCILLATOR

CROSS REFERENCE TO RELATED APPLICATIONS

This is the U.S. National Stage of International Application No. PCT/GB2014/053650, filed Dec. 10, 2014, which was published in English under PCT Article 21(2), which in turn claims the benefit of Great Britain Application No. 1322978.6, filed Dec. 24, 2013, both of which are incorporated herein by reference in their entirety.

This invention relates generally to an accurate electronic oscillator and specifically to calibration thereof.

Many electronic circuits require a clock source. This is commonly a high-frequency crystal oscillator in circuits which contain a microprocessor. However, such a high-frequency crystal oscillator draws significant current. For power-sensitive applications, it can therefore be desirable additionally or alternatively to use a relatively lower-power, lower-frequency clock source for some timing functions.

Such an arrangement is particularly desirable in battery-powered devices, where battery life can be conserved by keeping a main microprocessor and its high-frequency crystal powered-down for as much of the time as possible. A low-frequency oscillator and associated timer can be used in such contexts to generate a wakeup signal for the microcontroller and high-frequency crystal at a precise time with minimal power consumption (e.g. to meet a low-average-power transmission protocol, as will be explained below).

Commonly, a low-frequency clock signal is generated using a low-frequency crystal oscillator (e.g. a 32.768 kHz crystal) or a relaxation oscillator circuit (e.g. a resistor-capacitor (RC) oscillator).

A 32.768 kHz crystal oscillator can provide high accuracy (e.g. +/−30 parts per million (ppm)) with a relatively-low current consumption (e.g. 0.5 microamps). However, it requires an external crystal, which is a large, discrete component, and thus takes up considerable space on a printed circuit board (PCB). This can be a significant disadvantage in space-constrained devices such as mobile telephones. It also requires an additional two chip pins in order to connect to the integrated circuit. Moreover, an external crystal can add significantly to the total bill of materials for the circuit.

By contrast, a fully-integrated relaxation oscillator circuit occupies no chip pins and avoids the need for external components. It is also considerably cheaper than a crystal and can have similarly-low current consumption to the crystal oscillator. However, it is far less accurate than a crystal, having a typical accuracy of +/−300,000 ppm. With careful calibration (e.g. by appropriately adjusting a programmable resistor), this accuracy can be improved to around +/−10,000 ppm, but this is still a factor of 300 to 1000 times worse than the crystal oscillator.

Accurate timing is often critical to achieving good power efficiency in an application. This is especially true in a low-power radio system using packet-based transmission and time division multiplexing (TDM). In this situation, much of the circuitry on a slave device can be asleep for much of the time, with a low-frequency timer being used to wake up the necessary parts at the correct time to receive and process an incoming packet from a master transmitter. If 500-micosecond packets are transmitted every 1 second, then receiving and acknowledging a packet may take only around 1 millisecond. With an accurate clock, it should therefore be possible for the system to be largely powered down for up to 99.9% of the time.

However, if the low-frequency clock driving the timer is inaccurate, it will be necessary to open the radio receive window conservatively early, to minimise the chance of missing a transmitted packet due to the clock running slowly. An inaccurate clock therefore results in power being wasted because the receiver circuitry and microprocessor must be woken earlier than may be necessary. Even if the oscillator has an accuracy of +/−10,000 ppm, as a well-calibrated relaxation oscillator might, then the microcontroller must still be woken up 1% before the end of the idle period; i.e. 10 milliseconds early for a 1 second idle period. The receiver would then be awake for 11 milliseconds rather than the ideal 1 millisecond, leading to a substantial reduction in battery life for the slave device.

United Kingdom Patent No. 2488013 describes an improved low-power oscillator that can achieve an accuracy of +/−100 ppm. That accuracy is attained using a low-frequency oscillator, such as an RC oscillator, configured to switch between a first frequency and a second frequency. The switching occurs at intervals determined by an input representative of a target frequency, so as to cause an average output frequency of the oscillator to approximate the target frequency. The oscillator thereby improves the accuracy of a timer for driving a slave device, alleviating to an extent the problems mentioned above.

However, a low-power oscillator such as an RC oscillator generally will not run for long periods of time, particularly when ambient conditions such as temperature and other factors are varying, and maintain a constant, accurate frequency. The low-power oscillator therefore needs to be calibrated to ensure that a constant, accurate frequency is maintained, otherwise the power efficiency of a device using the oscillator will be compromised for the reasons explained above. However, calibration requires an accurate reference clock, such as a high-power crystal oscillator. The reference clock needs to be powered up each time it is used, which is also detrimental to the power efficiency of the device. Thus there remains a need for an improved low-power oscillator that can further increase the battery life for a slave device relying on the low-power oscillator for timing, at least by ameliorating the problem of the high power requirements associated with calibration.

The present invention seeks to provide an improved low-power oscillator.

The present invention provides a method of calibrating a first oscillator, comprising:
  measuring a temperature to obtain a measured temperature value;
  determining whether said measured temperature value differs from at least one previously measured temperature value by more than a threshold amount; and
  if said measured temperature does differ from said at least one previously measured temperature by more than said threshold amount, using a reference oscillator to calibrate the first oscillator.

The invention extends to apparatus, comprising:
  a first oscillator;
  a reference oscillator;
  a temperature sensing arrangement;
  a calibration arrangement for calibrating said first oscillator;
  wherein the apparatus is arranged to determine whether a temperature value measured by said temperature sensing arrangement differs from said at least one previously measured temperature value by more than a threshold amount and if said measured temperature does differ from said at least one previously measured temperature by more than said threshold amount, to use said reference oscillator to calibrate said first oscillator.

Some or all of the aforementioned apparatus may be provided on a common integrated circuit. However in a set of embodiments the reference oscillator is external. In some embodiments the temperature sensing arrangement could be external. The invention therefore extends to an integrated circuit comprising the apparatus features set out above but with an input for receiving a signal from a reference oscillator instead of the reference oscillator and/or a signal from a temperature sensing arrangement instead of the temperature sensing arrangement.

The invention extends to software, and a carrier bearing software, which when run on a suitable processor configures the processor to calibrate a first oscillator by carrying out the steps of:

receiving a measured temperature value;

determining whether said measured temperature value differs from at least one previously measured temperature value by more than a threshold amount; and if said measured temperature does differ from said at least one previously measured temperature by more than said threshold amount, using a reference oscillator to calibrate the first oscillator.

Thus in accordance with the invention an oscillator is calibrated by a reference oscillator when the temperature differs from a measured value by more than a threshold amount. The Applicant has appreciated that certain oscillators (for example low-frequency RC oscillators) may have a stable frequency at a fixed temperature. i.e. the frequency of oscillation of the oscillator at any given temperature is the same or substantially the same if the oscillator remains at that temperature, or if the oscillator is returned to that temperature having been operated at a different temperature. By utilising this property of such oscillators to calibrate a lower-power first oscillator using a higher-power reference oscillator when necessary because of a temperature change, but rarely or not at all at other times, the amount of time for which the reference oscillator must be powered up is reduced. This decreases overall power consumption.

Accordingly, in a set of preferred embodiments a request to power up the reference oscillator is issued when it is required to calibrate the first oscillator. This allows the reference oscillator to be powered down when not required. However the reference oscillator may be required for other purposes (e.g. as a clock for an on-board microprocessor) and so may be already running when a calibration is required and/or left running after a calibration is performed.

In a set of embodiments the first oscillator is an RC oscillator. These have a relatively low power consumption. However, other types of oscillator may be used, for example, the first oscillator may be a ring oscillator. The frequency of the first oscillator may be lower than the frequency of the reference oscillator.

The reference oscillator may be a high-frequency RC oscillator or a crystal oscillator. The reference oscillator preferably has a frequency of oscillation that is substantially independent of temperature.

In some environments or for some applications, the temperature may not vary significantly for long periods of time. However, the operation of the first oscillator, and therefore the accuracy thereof, may be affected by factors other than temperature e.g. a background drift. In some embodiments therefore the first oscillator is calibrated periodically even if not prompted by temperature. Periodic calibration may be carried out if a predetermined period has elapsed since the oscillator was calibrated in response to a temperature measurement. The interval between such calibrations may be fixed or variable. In some embodiments it may be varied according to data relating to the historical accuracy of the first oscillator. For example, if the first oscillator is determined to be relatively accurate (for example, because the circuit is not significantly affected by factors other than temperature), the interval between calibrations may be increased. This may lengthen the time for which the reference oscillator can be asleep, thereby saving power.

In a set of embodiments the temperature is measured at regular intervals—e.g. in response to a signal provided by a timer. It should be ensured that the temperature is monitored sufficiently frequently to detect a significant temperature change and calibrate the oscillator as needed. The temperature may also be measured if a 'background' periodic calibration is performed. In some embodiments, the temperature is measured by an asynchronous circuit comprising a temperature sensor. The asynchronous circuit may continuously monitor the temperature. The asynchronous circuit may send an interrupt signal to the calibration arrangement if the temperature changes by more than a certain amount compared with the temperature at which an interrupt signal was most recently sent. The interrupt signal may include temperature data or may simply prompt interrogation of the temperature measurement arrangement.

The at least one previously measured temperature value may be stored in a memory. In a set of embodiments only a comparison between a measured temperature and a temperature measured when the first oscillator was most recently calibrated, is made The first oscillator will thereby be calibrated whenever the temperature has changed by the threshold amount which should be set e.g. to ensure that the oscillator is calibrated if there is a temperature change significant enough to render the previous calibration insufficiently accurate to meet a specified accuracy.

In accordance with another set of embodiments, and particularly in view of the applicant's observation that certain oscillators (such as low-frequency RC oscillators) are stable at a given temperature, multiple previously measured temperature values are stored in the memory and compared against a subsequent temperature measurement. This enables multiple calibration results corresponding to calibrations carried out at different temperatures to be stored in a look-up table. The calibration results may be values such as bias, correction or offset values, that can be used to correct the oscillator without having to recalibrate using the reference oscillator.

The advantage of this arrangement is that it can allow a new calibration to be carried out only if the temperature differs by a threshold amount from all of the previously stored values. This will reduce the number of calibrations (and thereby the power consumption) further.

Each temperature value in the memory may have an associated calibration result. When a new calibration is carried out the measured temperature value and a corresponding calibration result may be added to the memory. This allows a device-specific look-up table to be built up which may progressively reduce the need for calibrations prompted by temperature.

As mentioned above, the accuracy of the first oscillator may be affected by factors other than temperature. It may therefore be advantageous occasionally, e.g. periodically, to calibrate the first oscillator at temperatures for which there is already a calibration result in the memory, or a temperature close to it. When such a calibration is carried out the calibration result corresponding to the temperature in the memory may be updated. Optionally the temperature may be stored as well if it is not exactly the same as the stored temperature.

The reference oscillator may be of any suitable type. For example high-frequency RC oscillators and crystal oscillators can both provide high accuracy timing. However, the measured temperature value provided by the temperature sensor may depend on a reference frequency provided by the reference oscillator to the temperature sensor. For example, the temperature sensor may use a ring oscillator having a temperature-dependent frequency, where the temperature-dependent frequency is compared with a reference frequency from the reference oscillator to determine the temperature. The temperature measurements may therefore be dependent on the reference oscillator that provides the reference frequency e.g. the type of reference oscillator (high-frequency RC oscillator, crystal oscillator etc.)

Although power may be required to run the reference oscillator, for example, if the reference oscillator is a crystal oscillator or high frequency RF oscillator, the temperature measurement can typically be performed much more quickly than a calibration (e.g. of the order of 10 µs compared with 10 ms), and so less energy is needed for a temperature measurement than for a calibration. Having frequent temperature measurements and infrequent calibrations therefore still offers considerable energy savings compared with methods involving frequent calibrations.

In a set of embodiments a plurality of reference oscillators is provided. These may be of different types. In a set of embodiments the previously stored temperature value is associated with an indication of which reference oscillator, e.g. what type of reference oscillator, was used to perform the measurement. The memory may therefore include previously measured temperature values for each oscillator. For example a measured temperature value may be recorded to a first memory location if the reference oscillator is of a first type, e.g. a crystal oscillator, and may be recorded to a second memory location if the reference oscillator is of a second type that is different from the first type, e.g. a high-frequency RC oscillator.

Where a device has a plurality of reference oscillators it may be arranged preferentially to use a reference oscillator that is already running in order to perform a calibration. This is more energy efficient than powering up an oscillator especially for the purpose of calibration.

In a set of embodiments the memory comprises a plurality of data sets of temperature values and associated calibration results, wherein each set of the plurality of data sets corresponds to a different reference oscillator. This allows the build-up of a look-up table in the manner explained above for each reference oscillator.

It may be desirable for steps relating to measuring a temperature, determining whether there has been a temperature change and optionally sending a signal from a temperature measurement module to a central processor indicating that there has been a temperature change, to occur automatically. It is particularly desirable for these steps to be implemented automatically by hardware. Interaction with software is thereby advantageously limited to steps performed in when there has been an above-threshold temperature change.

In some embodiments, the temperature is measured by a temperature sensor having hardware configured automatically to measure temperature, for example, periodically, continuously, according to a sampling schedule, in response to an event, or if the temperature changes by a certain amount as previously discussed. Upper and lower temperature thresholds corresponding to the previously measured temperature value plus and minus the threshold amount respectively may be provided to or defined by the hardware. The hardware may also be configured to determine whether the measured temperature value exceeds an or the upper threshold or is below a or the lower threshold. The hardware may also be configured automatically to provide a signal indicating that the temperature has exceeded an or the upper threshold or fallen below a or the lower threshold and thereafter to automatically update the upper and lower thresholds based on the measured temperature value.

The dependence of the first oscillator's frequency on temperature may or may not be linear. For example, at some temperatures, the frequency may vary significantly with temperature, and thus in some temperatures ranges calibration may be required if there is even a relatively small temperature change. Conversely, the frequency may change vary little with temperature in some temperature ranges, and thus in some temperatures ranges calibration may be required only if there is a relatively large temperature change. Accordingly, in some embodiments of the present invention, the threshold amount may be assigned different values for different temperatures or different temperature ranges. The threshold amount may be assigned different values depending on the type of reference oscillator. There may be other relevant factors which give rise to different threshold amounts such that in general the threshold amount is not necessarily fixed.

It is not necessary for a previously measured temperature value to be stored as a direct temperature value. For example, it could be recorded as a deviation from a fixed specified temperature value, or it could be recorded or accordingly to a representative formula this is not directly a temperature value.

The following paragraphs describe optional features in accordance with some embodiments of the present invention. These features define an oscillator which may constitute the first oscillator specified above. However, other types of oscillators may be used in other embodiments of the present invention. It outputs an averaged frequency that approximates a target frequency by switching between a first and second frequency.

Calibration of the first oscillator may comprise a coarse and/or a fine calibration as described further below. A calibration result may comprise calibration values relating to either or both of coarse and fine calibrations, and/or relating to a target frequency.

The oscillator may be configured to be switched between a first frequency and a second frequency; and switching means may be provided, the switching means being configured to receive an input representative of a target frequency and to switch the oscillator between the first and second frequencies at intervals determined by the input so as to cause an average output frequency of the oscillator to approximate the target frequency.

The integrated circuit comprising such an oscillator may further comprise a microprocessor or microcontroller (e.g. a system-on-chip).

By suitably configuring the pattern of switching between the two output frequencies, the oscillator can synthesise an output frequency which is exactly or approximately equal to a target frequency (when averaged over a number of cycles). The oscillator can be calibrated to produce a desired, effective output frequency with far greater precision than is possible with known RC oscillators that simply employ a fixed capacitor in combination with a fixed or programmable resistor.

The Applicant believes that accuracies of +/−100 ppm are achievable using embodiments having such an oscillator, which is some 100 times better than a conventional, calibrated RC oscillator. This accuracy approaches that of a crystal oscillator, without the cost and space requirements of a crystal, while still sharing the low-power characteristics of a low-frequency crystal.

Preferably the two frequencies are similar, which enables the output frequency to be controlled accurately and smoothly. Thus the higher of the first and second frequencies is preferably less than double the lower of the two frequencies; more preferably it is less than 10% higher; and most preferably it is around 3% higher. For example, the ratio between the two frequencies may be 33:32 or thereabouts. The ratio is ideally set such the difference (which may be absolute or relative) between the two frequencies is wider than a smallest increment by which one or other of the frequencies can be adjusted (e.g. by controlling a current source for the oscillator). In this way, any error that remains after a coarse calibration of one or both of the oscillator frequencies can be corrected for by appropriate switching between the two frequencies.

Under normal operation the target frequency should have a value somewhere between the first and second frequencies.

Because the output of the oscillator can be controlled very accurately, it is possible to switch seamlessly between using the output from the oscillator circuit and using the output of some other clock source, such as a crystal oscillator or a low-frequency clock synthesized from a higher-frequency clock.

The input to the switching means may comprise a digital signal or an analogue signal representative of the target frequency. In some embodiments, the input comprises or encodes a value indicating a switching ratio between the first and second frequencies. This ratio may represent a proportion of oscillator cycles at which the oscillator should operate at the first frequency, relative to the second frequency. For example, the input may comprise a digital value (e.g. a 10-bit number) indicating the number of oscillator cycles out of every 1024 cycles for which the oscillator should operate at the lower of the two frequencies. The switching means may determine how to switch between the two frequencies over a period of time (a switching pattern) so as to meet the indicated ratio.

The calibration arrangement specified in accordance with the invention may be a calibration controller. The input to the switching means may be provided by the calibration controller, which may form part of the first oscillator or may be separate therefrom. The calibration controller may be configured to perform a (fine) calibration of the oscillator at intervals in order to generate an updated input to be provided to the oscillator.

The first oscillator is calibrated against a reference clock generated from the reference oscillator, which may be a crystal oscillator, such as a relatively high-frequency crystal connected to a microprocessor (e.g. a crystal which oscillates one, two or three orders of magnitude faster than the target frequency of the present oscillator circuit). Because the calibration operation usually only needs to be performed when temperature changes significantly, it is not necessary for the high-frequency crystal to be powered up continuously or frequently, thus resulting in power-savings made possible by the present invention.

The first oscillator is preferably fully integrated on a semiconductor substrate. This makes it very compact and able to be incorporated in a circuit without adding to the bill of materials.

The first oscillator may be of any suitable design. It may, for example, be a relaxation-type oscillator, or a ring oscillator. Whatever design is used, however, it is preferably able to switch rapidly between the two frequencies; e.g. switching from one cycle to the next, with no residual effect from the frequency setting of the preceding cycle.

The first oscillator circuit may comprise charge-storing means whose capacitance can be varied between a first value and a second value; and a current source connected to the charge-storing means, to form an oscillator configured to oscillate at the first frequency when said capacitance is equal to the first value, and at the second frequency when the capacitance is equal to the second value. The switching means is then configured to switch the charge-storing means between the first and second capacitance values at intervals determined by the input.

Methods of operating an integrated-circuit oscillator where the oscillator comprises charge-storing means whose capacitance can be varied between a first value and a second value, and a current source connected to the charge-storing means to form an oscillator which oscillates at a first frequency when said capacitance is equal to the first value, and at a second frequency when the capacitance is equal to the second value, may comprise switching the charge-storing means between the first and second capacitance values at intervals determined by the target frequency so as to cause the average output frequency of the oscillator to approximate the target frequency.

The charge-storing means may comprise one or more capacitors. It may be continuously variable between the first and second capacitance values, but is preferably arranged to be switched discretely between the two values. Of course, more than two capacitance values may be used, such as three or more values, with the switching means being arranged to switch between the three or more values. However, embodiments that use just two values are simpler to implement than those using more than two, and nonetheless provide all the described benefits of accuracy and low power.

The charge-storing means may comprise a first capacitor that is permanently connected into the oscillator circuit, a second capacitor that is selectively connectable into the circuit (e.g. in series with the first capacitor, or in parallel), and a switch (e.g. a transistor) arranged to connect the second capacitor into or out of the circuit so as to alter the overall capacitance of the charge-storing means. The second capacitor is preferably smaller than the first, e.g. less than 50% or 10% of the capacitance of the first capacitor; more preferably around 3% of the capacitance, so that the total capacitances with and without the second capacitor differ by only around 3%.

Alternatively, the charge-storing means may comprise first and second capacitors having first and second capacitances, and a switch arranged to connect one or other of the first and the second capacitor into the oscillator circuit at a time. In this case, the second capacitance differs from the first preferably by less than 50% or 10%, and most preferably by around 3%. For example, the capacitance ratio may be 33:32.

In both of the above-mentioned arrangements, it will be appreciated the first or second capacitors need not in practice comprise single integrated structures, but may comprise a plurality of capacitors acting together as a single charge store. Different capacitors may be used for each half period of the clock cycle.

The current source may comprise resistance means (e.g. one or more resistors), or any other suitable means (e.g. an active current source or transistor current source). It may comprise programmable current gearing of a source.

The switching means may switch between the first and second capacitance values in any appropriate way that results in the average output frequency of the oscillator approximating the target frequency. The average output may be the mean output over a predetermined period of time, such as a predetermined number of cycles.

The output of the oscillator may substantially equal the target frequency value when averaged over a suitable period (e.g. the mean over 1024 cycles), or it may approximate the target frequency, by being within an acceptable margin of error or degree of precision, such as within plus or minus 100 ppm. The oscillator output will typically not exactly attain the theoretical target value. Moreover, when the frequency switching operation is performed according to a ratio over a finite number of cycles, the target frequency may not be able to be met precisely even under ideal circumstances, due to numerical rounding effects. The input to the switching means may, therefore, be determined to be the value from a range of allowable inputs which gives an output frequency that comes closest to the target frequency over a period of time.

The switching means may be configured to distribute high and low frequency cycles across a finite time period so as to produce a relatively smooth output. For example, it may be configured to distribute the frequency cycles at the first frequency as uniformly as possible among the frequency cycles at the second frequency. It may distribute the first-frequency cycles among the second-frequency cycles according to some predetermined pattern or dispersion characteristic. It may be configured to maximise the number of changes of frequency over a time period. By appropriately configuring the frequency switches, the oscillator output can be made to have minimal deviation from the average output frequency (i.e. minimal accumulated jitter over time).

The switching means may be any suitable switching circuit or component. It may comprise a sigma-delta modulator, arranged to distribute the frequency cycles at the first frequency as uniformly as possible among the frequency cycles at the second frequency, over a finite time period.

In order to work effectively, the values of the first and second frequencies should span the value of the target output frequency. To support a range of target outputs, in some embodiments, one or both of the first and second capacitance values can be varied. The oscillator is may be arranged so that the value of one, or preferably both, of the first and second frequencies depends on the level of a variable current within the oscillator circuit. The oscillator may comprise a programmable current source, e.g. comprising a programmable resistor, or programmable current gearing of a source, which can be used to adjust the current level and thereby alter the first or second frequencies, or both. Such adjustment may be relatively coarse, compared with the relatively fine adjustment of the output frequency which is possible by controlling the switching means.

A coarse calibration may be performed, in which the values of the first or second frequencies, or both, are adjusted so that they span a target frequency (with one being higher and the other being lower than the target frequency). The oscillator may be coarsely calibrated by adjusting the higher of the two frequencies, with the lower frequency being determined as a fixed ratio of the higher frequency, or as a constant offset from the higher frequency.

The coarse calibration may be made against a reference, e.g. crystal oscillator, such as a system clock. The calibration may be performed by adjusting a current source, e.g. by adjusting one or more programmable resistors. A current source may be configured to be programmable in percentage steps of the nominal frequency of the oscillator, e.g. 2.5% steps. (The nominal frequency can be the higher or lower of the two frequencies, or an intermediate frequency, such as the mean of the two). The precision of the coarse calibration (e.g. 2.5%) is preferably finer than the difference between the higher and lower frequencies (e.g. 3%), so that any remaining error after a coarse calibration can always be corrected for by a fine calibration operation (described below). Such coarse calibration might typically result in a frequency accuracy for the higher or lower frequencies of around +/−25,000 ppm, similar to a conventional, calibrated RC oscillator.

Additionally or alternatively, a fine calibration operation may be performed to generate an input to the switching means that causes the output frequency of the oscillator to approximate the target frequency. This may result in a final accuracy for the oscillator of around +/−100 ppm. The calibration controller may count oscillator output cycles over a reference time period (measured against a reference clock) for each of the first and second frequencies, and may derive the input to the switching means from these counts, e.g. by calculating the proportion of cycles the oscillator should perform at the lower frequency for a given target output frequency.

A target output frequency may be provided to the controller. The controller may be configured to perform a coarse calibration if it determines that the first and second frequencies no longer span the target frequency (e.g. when performing a fine calibration operation).

A coarse calibration and/or fine calibration may be performed when the chip is first powered up or reset.

Where provided the integrated circuit may further comprise a microprocessor or microcontroller which is clocked using the reference oscillator and which is turned on at or around the same time as the reference oscillator.

Calibration may be performed simultaneously with the reference oscillator or microprocessor or microcontroller being turned on, or within a period of time before or after such turning on.

The apparatus—e.g. the integrated circuit—may comprise circuitry forming all or part of a radio transmitter or receiver, and which is configured to transmit or receive radio packets according to a schedule implemented using the first oscillator as a clock source.

The apparatus may be configured to provide a clock signal, derived from a or the reference oscillator, e.g. a crystal oscillator, while the oscillator is being calibrated, and to output a clock signal derived from its own oscillations when it is not being calibrated. In this way a clock is still available during calibrations. Preferably, the two outputs are of substantially the same frequency (e.g. within the limits of the accuracy of the oscillator). The change from one output type to the other is preferably made within one clock cycle, so that there is a seamless transition in the output signal.

The output of the first oscillator may be sent to a timer, e.g. a timer located on the same integrated circuit as the first oscillator. This timer may be used to control the power state of parts of the circuit, such as a microprocessor, microcontroller, radio transmitter components, radio receiver components, etc.

Certain preferred embodiments of the invention will now be described, by way of example only, with reference to the accompanying drawings, in which.

Figure 1:
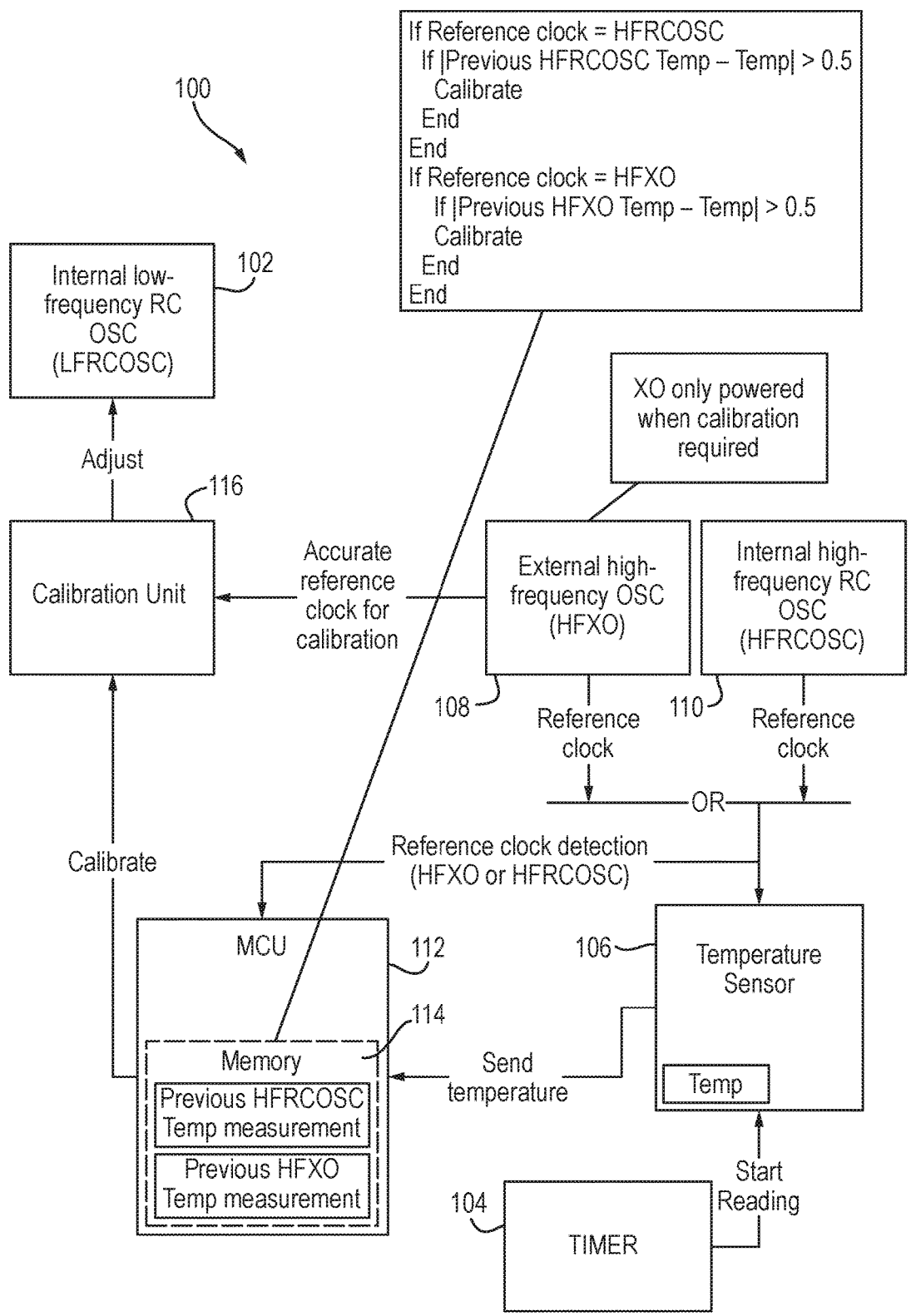
FIG. 1 is a schematic representation of the interaction of components of an integrated oscillator circuit according to an embodiment of the present invention.

FIG. 1 shows a schematic representation of an integrated oscillator circuit 100 according to an embodiment of the present invention, illustrating the interaction of the circuit components. The circuit 100 comprises internal low-frequency RC oscillator (LFRCO) 102. A timer 104 provides signals to a temperature sensor 106 indicating when the temperature sensor 106 should measure the ambient temperature. The timer 104 may indicate to the temperature sensor 106 to measure the temperature periodically or according to some other sampling schedule. The temperature sensor 106 uses a reference clock input for determining the temperature. The reference clock input is provided from one of two reference oscillators 108, 110 provided in, or in communication with, the circuit 100. The first reference oscillator 108 is an external high-frequency crystal oscillator (HFXO). The second reference oscillator 110 is an internal high-frequency RC oscillator (HFRCO).

When the temperature sensor 106 has measured the temperature to obtain a measured temperature value, the temperature sensor 106 sends the measured temperature value to a microcontroller 112. In some other embodiments, the temperature sensor 106 may send an interrupt signal to the microcontroller 112 indicating that a new temperature is available, which the microcontroller 112 may then read from the temperature sensor 106.

The microcontroller 112 comprises a memory 114 which stores two previously measured temperature values: the temperature at which the LFRCO 102 was last calibrated in the case that the temperature was obtained using the HFXO 108 as the reference clock; and the temperature at which the LFRCO 102 was last calibrated in the case that the temperature measurement was obtained using the HFRCO 110 reference clock.

The microcontroller 112, in response to receiving a measured temperature value from the temperature sensor 106, detects which of the reference oscillators 108, 110 was used as the reference clock for the temperature sensor measurement. The microcontroller 112 then compares the measured temperature value with the previously measured temperature value for which the same reference clock was used. This is because the temperature sensor measurement is sensitive to the type of oscillator used as a reference clock.

If the microcontroller 112 determines that the measured temperature value differs from the previously measured temperature by more than a threshold amount, the microcontroller 112 sends a signal to the calibration unit 116 indicating that the measured temperature value differs from the previously measured temperature value by more than the predetermined amount.

If the measured temperature value does not differ from the previously measured temperature value by more than the predetermined amount, no such signal is sent.

The signal from the microcontroller 112 may comprise an instruction to calibrate the low-power oscillator 102. The signal need not contain data explicitly indicating that there has been a temperature change. For example, the microcontroller may send a signal instructing the calibration unit to calibrate the low-power oscillator when the temperature has changed, but it may also send such an instruction for, for example, a periodic calibration that is not in response to a temperature change. The actual data content of the signal in both cases may be the same.

In response to receiving the signal, the calibration unit 116 calibrates the LFRCO 102. To calibrate the LFRCO 102, the calibration unit 116 obtains an accurate reference clock signal (i.e. a reference frequency), which is used for the calibration described in more detail later. The calibration unit 116 determines a calibration result, which is a value used to adjust the parameters of operation of the LFRCO 102, such that the output frequency of the LFRCO 102 is of an improved accuracy. Thus the LFRCO 102 is maintained at a target frequency with improved accuracy, and can be used to drive a timer with improved accuracy. As the reference oscillator 108, 110 is only powered when calibration is required, the LFRCO 102, and therefore the timer, has a reduced power consumption compared with timers according to the prior art.

Figure 2:
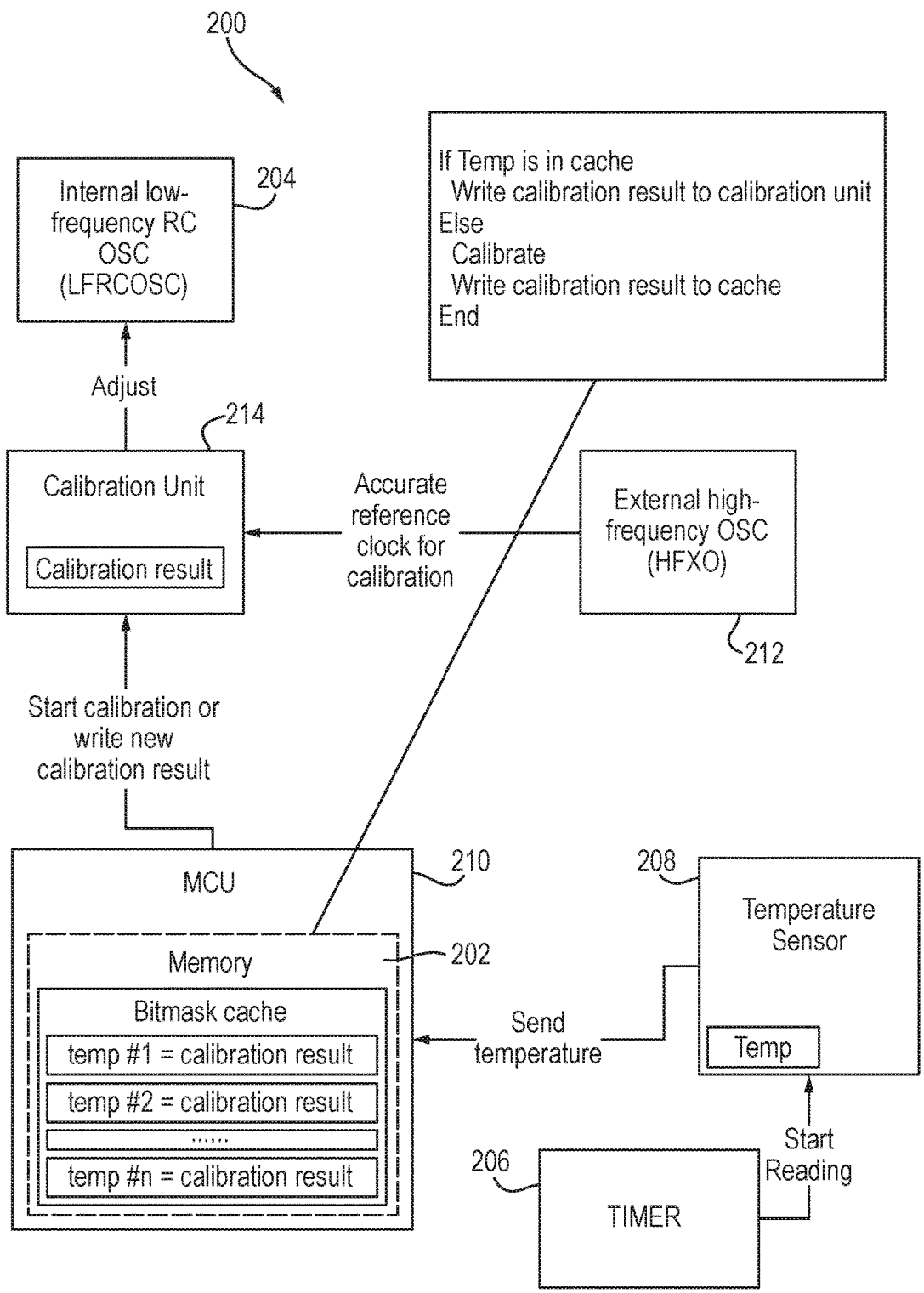
FIG. 2 is a schematic representation of the interaction of components of an integrated oscillator circuit according to a further embodiment of the present invention.

FIG. 2 shows a schematic representation of an integrated oscillator circuit 200 according to a different embodiment of the present invention. In this embodiment, a memory cache 202 is used to store calibration results to further minimise the power consumption of the low-power oscillator, which in this embodiment is also a low-frequency RC oscillator (LFRCO) 204. A timer 206 sends signals to a temperature sensor 208 in the same way as in the previously described embodiment. In response to the signals sent from the timer 206, the temperature sensor 208 measures the ambient temperature. The measured temperature is passed to a microcontroller 210. The microcontroller 210 contains a memory cache 202 in which temperature value and calibration result data pairs are stored.

In the present embodiment, only one type of reference oscillator is provided. The reference oscillator is an external high-frequency crystal oscillator (HFXO) 212.

However, it will be appreciated that additional reference oscillators (e.g. an internal high-frequency RC oscillator as in the previously described embodiment) may be provided. In that case, the memory cache 202 may contain more than one set of temperature value and calibration result data pairs, each set corresponding to a different reference oscillator.

When a new measured temperature is sent from the temperature sensor 208 to the microcontroller 210, the microcontroller 210 determines whether the new measured temperature is stored in the memory cache 202. The temperature values stored in the cache 202 correspond to previously measured temperatures, i.e. temperatures at which the LFRCO 204 has previously been calibrated and for which a calibration result has been stored. A temperature may be deemed to be stored within the cache 202 if the measured temperature value is within a predetermined amount of a temperature value that is in the cache 202. For example, if a temperature of 25° C. is stored in the cache 202, a measured temperature of 25.3° C. may be deemed to correspond to the stored temperature of 25° C., for example if the predetermined amount is +/−0.5° C. In that case, when a new temperature value is added to the cache 202, it may be rounded to an appropriate precision. In the example above, the temperature value may be rounded to the nearest degree Celsius.

Alternatively, the temperature value may be stored precisely, i.e. with the same precision as the temperature sensor measurement. For example, the temperature values may be rounded to the nearest 0.1° C. This may give rise to an overlap in temperature ranges corresponding to the stored temperature values (i.e. temperatures separated by less than twice the threshold amount). A measured temperature may then fall within the threshold amount of more than one stored temperature value. In such an event, the microcontroller 210 may identify the stored temperature value closest to the measured temperature value, or could interpolate, average etc.

The microcontroller 210 reads a calibration result associated with the stored temperature that corresponds to the measured temperature. This calibration result is then sent to a calibration unit 214.

However, if the measured temperature values does not fall within the threshold amount of any of the stored temperature values, the microcontroller 210 sends a signal to the calibration unit 214 indicating that it should perform a calibration. The calibration unit 214 then obtains accurate reference clock signal (i.e. a reference frequency) from the reference oscillator 212. This reference clock signal is used to calculate a new calibration result which is used to calibrate the LFRCO 204. The calibration result is then sent back to the microcontroller 210. The microcontroller 210 writes the measured temperature and corresponding calibration result as a data pair to the memory cache 202.

In accordance with the above described embodiment of the present invention, the HFXO 212, which is powered when a reference clock signal is required for calibration, is powered infrequently, at least for this purpose, because calculation of calibration results can be limited to cases where the measured temperature and a corresponding calibration result have not previously been written to the memory cache 202. Thus the power requirements of the integrated oscillator circuit 200 are significantly reduced. Where a calibration result is already recorded for a measured temperature or one within a second threshold, the LFRCO 212 can be still calibrated without powering the reference oscillator 212 as no new calibration result is calculated. Thus the LFRCO 204 can be calibrated whenever the temperature changes to maintain an accurate frequency of the LFRCO 212, without necessarily always having to power the reference oscillator 212 for the calibration, thereby substantially reducing the power requirements of the circuit 200 compared with the prior art.

Figure 3:
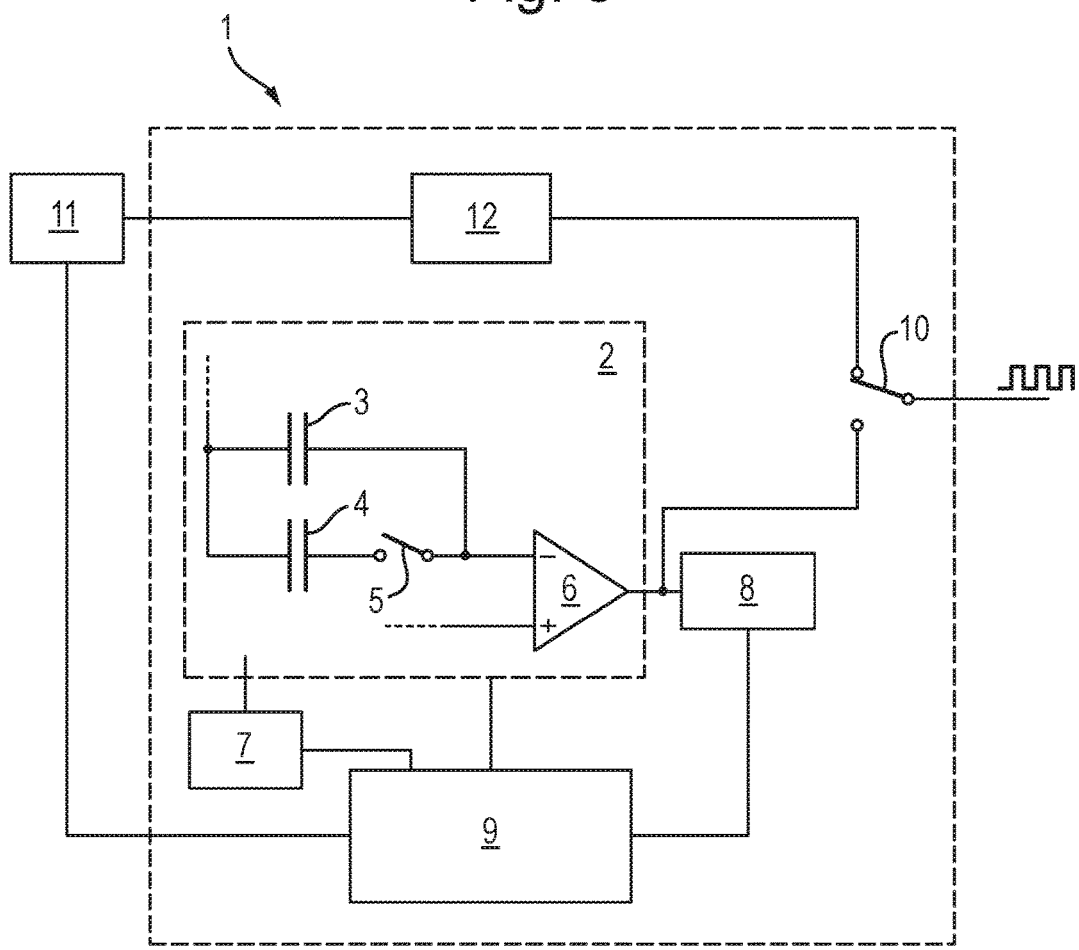
FIG. 3 is a diagrammatic overview of key components an oscillator circuit embodying the invention.

FIG. 3 figuratively shows key parts of a 32 KiHz (1 kibiHertz=1024 Hertz) oscillator and calibration circuit 1 in accordance with some embodiments of the invention.

The oscillator circuit 1 comprises an RC oscillator 2 which, among other well-known components (not shown), has a first capacitor 3 and a second capacitor 4. A switch 5 (e.g. a transistor) connects the second capacitor 4 into the circuit, in parallel to the first capacitor 3, when it is closed. When the switch 5 is open, only the first capacitor 3 is used in the RC oscillator circuit. A comparator 6 uses a supplied reference voltage to provide feedback to the RC oscillator and to generate an oscillating output. The RC oscillator receives a controlled current from a programmable current source 7.

The output from the RC oscillator 2 passes through a calibration counter 8, which is connected to control logic 9. The output also passes via a switch 10 (e.g. a multiplexer) before leaving the oscillator. This switch 10 can select between the RC oscillator output, and the output of a frequency-down-converter 12, which is fed by an off-chip 16 MHz crystal oscillator 11 ("16 MHz XOSC"). The frequency-down-converter 12 generates a 32 KiHz signal from the crystal oscillator 11.

The control logic 9 receives an input from the 16 MHz crystal oscillator 11, from which it can derive a 4 MHz signal, which it uses to calibrate the RC oscillator 2. The control logic 9 is able to control the capacitor switch 5, the output switch 10, and the programmable current source 7.

When correctly calibrated, the oscillator circuit 1 outputs a signal from the RC oscillator 2 which is effectively at 32 KiHz. The input current is set such that, when the second capacitor 4 is switched into the circuit, the RC oscillator output frequency is a little below 32 KiHz, and when the second capacitor 4 is switched out of the circuit, the RC oscillator output frequency is a little above 32 KiHz. The control logic 9 controls the capacitor switch 5 so as to switch the second capacitor 4 in and out of the circuit from cycle to cycle according to a pattern that gives an output from the oscillator circuit 1 averaging 32 KiHz over a number of cycles, with negligible frequency jitter.

In order to achieve this calibrated state, the control logic 9 can apply a coarse calibration operation and a fine calibration operation.

The control logic 9 counts, using the calibration counter 8, the number of 4 MHz pulses derived from the crystal oscillator 11 that occur during 256 pulses of the RC oscillator operating at its higher frequency (i.e. with the second capacitor 4 switched out of the circuit). If the frequency of the RC oscillator is determined to be outside an intended frequency range, a coarse calibration is performed by adjusting the programmable current source 7 so as to increase or decrease the current supplied to the RC oscillator 2 in increments, until it is within the acceptable range.

When the coarse calibration is correct, a fine calibration operation can be performed. The control logic 9 counts the number of 4 MHz pulses derived from the crystal oscillator 11 that occur during 256 pulses of the RC oscillator operating at its higher frequency (i.e. with the second capacitor 4 switched out of the circuit) and again with the RC oscillator operating at its lower frequency (i.e. with the second capacitor 4 switched into the circuit). The control logic 9 uses these two count values to determine the proportion of high- to low-frequency cycles that are needed over a calibration period (e.g. of 1024 cycles) in order to achieve the desired 32 KiHz output. This calculation is explained in more detail below.

The control logic 9 uses the latest proportion value to control the capacitor switch 5 to give the desired cycle ratio. A sigma-delta circuit is used to distribute the low-frequency cycles uniformly amongst the high-frequency cycles, as explained in more detail below.

During the calibration operation, it is not possible to provide an accurate output from the oscillator circuit 1 using the RC oscillator 2 (since it must be run for a set number of cycles at each frequency). Therefore, the control logic 9 switches the output switch 10 to provide a 32 KiHz output signal from the oscillator 1 that is derived from the external crystal 11. The crystal-derived output may also be used when the control logic 9 determines that a calibration operation is required, but is waiting to perform it.

The implementation is described in more detail below.

Figure 4:
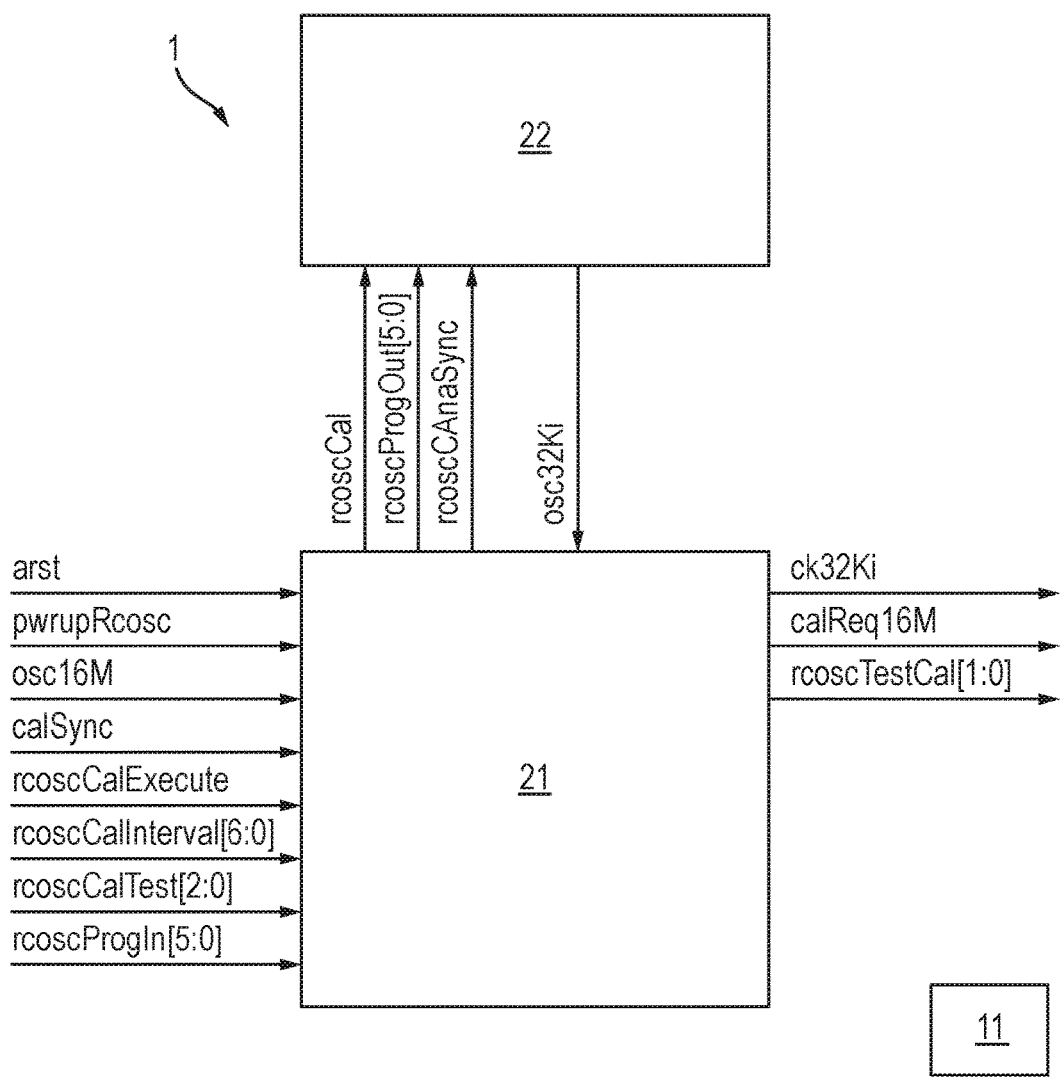
FIG. 4 is a diagrammatic overview showing signals to and from the digital and analogue parts of the circuit.

FIG. 4 shows how the oscillator circuit 1 is divided into a digital part 21 and an analogue part 22. Some of the important signals between the parts 21, 22 are shown.

The analogue part 22 contains an RC oscillator circuit which is calibrated by the digital part 21. Coarse and fine calibration operations can be performed.

The digital part 21 of the oscillator can receive inputs from other parts of an integrated circuit, such as a microcontroller (not shown), and the external 16 MHz crystal oscillator 11. In particular, it is configured to receive the following input signals:

| SIGNAL NAME | DESCRIPTION |
| --- | --- |
| arst | Reset pin. Active high. |
| pwrupRcosc | Enable digital circuit if high. |
| osc16M | Clock signal from 16 MHz crystal oscillator |
| calSync | Calibration synchronization. Goes high at least 15 ms before 16 MHz crystal oscillator is started up e.g. for use by a microcontroller. Goes low after control of the 16 MHz crystal oscillator has passed to a wake-up timer. |
| rcoscCalExecute | Initiates a calibration cycle. If rcoscCalInterval = 0x00: Calibrate when high. If rcoscCalInterval <> 0x00: Auto calibration as defined by rcoscCalInterval when high. No calibration when low. |
| rcoscCalInterval[6:0] | Time between calibration of oscillator in multiples of 0.25 seconds (range 0.25 to 31.75 sec). If set to 0x00 calibration will start at positive edge of rcoscCalExecute and positive edge of calSync. |

The digital part 21 can output the following signals:

| | |
| --- | --- |
| ck32Ki | 32 KiHz (32,768 Hz) clock output. |
| calReq16M | Request to turn on 16 MHz crystal oscillator for use in calibration. If calSync is high, keep calReq16M high until calSync goes low. |

The analogue part 22 outputs a 32 KiHz clock signal as follows:

| SIGNAL NAME | DESCRIPTION |
| --- | --- |
| osc32Ki | 32 KiHz clock signal |

The analogue part 22 is controlled by the digital part 21, via the following signal inputs:

| | |
| --- | --- |
| rcoscCal | When high the period of the 32 KiHz oscillator output will increase by 1/32. Changes value on positive edge of ck32Ki. |
| rcoscProgOut[5:0] | Process tuning of current source in analogue part of oscillator (coarse calibration). |
| rcoscAnaSync | Reset signal for analogue part. Used to start oscillator in phase when the RC oscillator takes over from the crystal-oscillator-derived 32 KiHz. |

Figure 5:
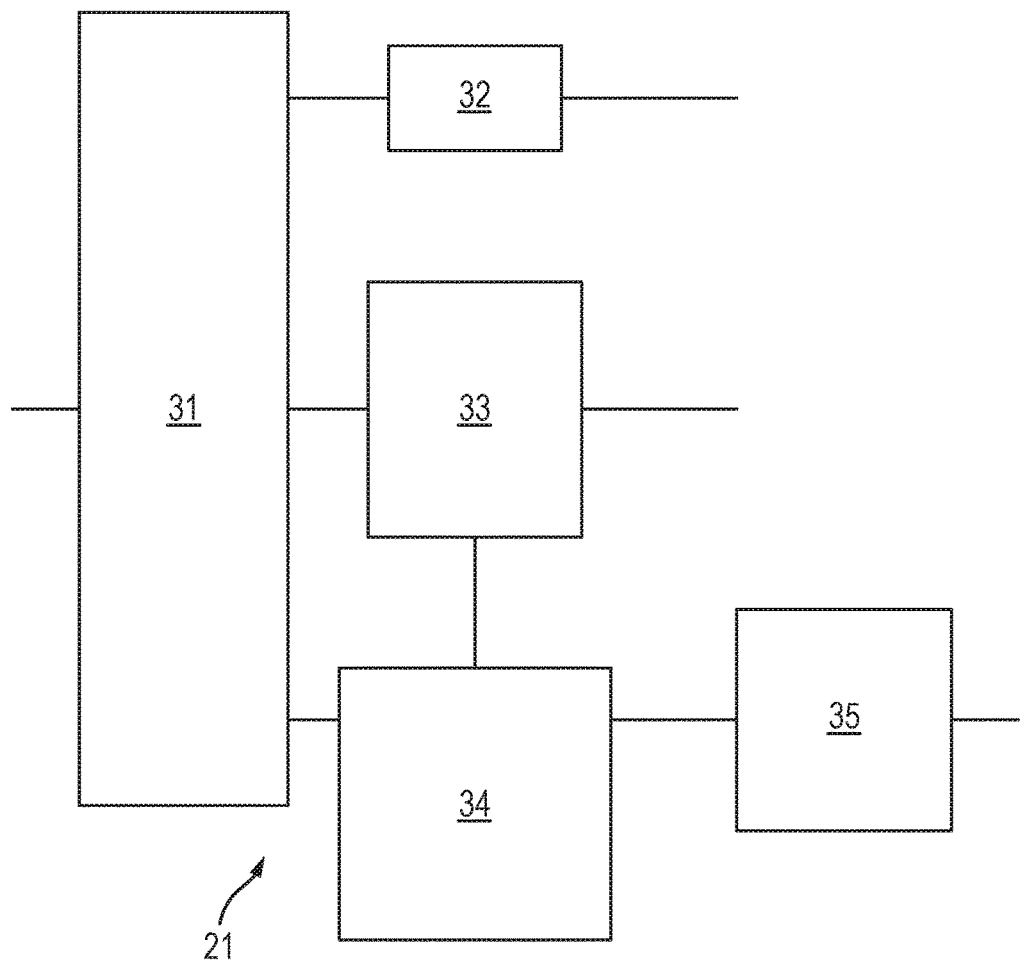
FIG. 5 is a diagrammatic representation of digital components of the circuit.

FIG. 5 gives an overview of the architecture of the digital part 21.

At a high level, the digital part 21 comprises: a calibration interval timer 31; a control circuit 32 for the analogue RC-oscillator; a calibration engine 33; a combined clock de-bouncer and divide-by-4 circuit 34; and a down-converting module 35 to generate a 32 KiHz clock from a 16 MHz source.

The digital part 21 is responsible for: performing coarse calibrations of the oscillator; performing fine calibrations of the oscillator; generating an accurate 32 KiHz clock from the oscillator; and generating an accurate 32 KiHz clock from the external 16 MHz crystal oscillator 11.

The calibration interval timer 31 is the main controller of the digital part 21. It is always operating as long as pwrupRcosc is high. It serves several purposes:

on power-up it ensures the other modules in the system (including the analogue part 22 and the off-chip 16 MHz crystal oscillator 11) are started in the correct sequence;

it performs seamless switching between the RC-oscillator and the 16 MHz crystal-oscillator-derived output;

it decides if or when a periodic calibration is due—e.g. because no temperature-induced calibration has been performed within a timeout period—and consequently starts up the 16 MHz crystal oscillator 11, the calibration engine 33, etc.; and when pwrupRcosc goes low it performs safe shutdown of the other modules in the system in the right sequence.

The control circuit 32 for the analogue part 22 has control over the analogue RC-oscillator during normal operation (i.e. in an interval between two calibrations).

The control circuit 32 is fully synchronous design, always operating on the RC-oscillator clock.

For a coarse calibration, the digital part 21 uses the 6-bit signal rcoscProgOut to control the analogue part 22. After reset or power-up this value is set to a default value. The calibration engine 33 counts pulses from a 4 MHz clock derived from the system clock during 256 pulses of the RC oscillator running at its higher frequency. The result of this measurement is used to increase or decrease the oscillator current via the programmable current source 7. This is repeated until the frequency of the oscillator is within 0 to 2.5% above the intended frequency.

In each coarse calibration cycle, the value can be stepped one value up or down. After a change up or down, the calibration operation is restarted after a delay of eight 32 KiHz cycles (to allow the analogue part 22 to settle) and the output measured again. Once the coarse calibration is correct, the RC oscillator will be running within 100.0 to 102.5% of 32 KiHz if rcoscCal is low, and within 97.5 to 100.0% if rcoscCal is high.

Fine calibration makes use of the capability in the analogue part 22 to selectively increase the oscillator period by 1/32. The fine calibration algorithm measures the oscillator's nominal period (T1) and the longer period (T2), and calculates from these how many periods N the oscillators should run at T2 during a 1024 period sequence so that the average output frequency of the oscillator is 32 KiHz (32.768 kHz).

In a fine calibration, the RC oscillator output frequency is measured as in the coarse calibration, but at both the higher frequency f1 and the lower frequency f2, in order to obtain a count X1 of 4 MHz pulses at the higher frequency, and a count X2 of 4 MHz pulses when the RC oscillator is running at the lower frequency, during a period of 256 RC oscillator cycles.

The value N is calculated as $$N(X1, X2) = 1024 * (31250 - X1)/(X2 - X1).$$

(noting that 31250=256*4,000,000/32,768).

For the coarse calibration to be valid, the X1 value must not exceed 31250 (if it does, this is flagged as an error, and the coarse calibration must be adjusted). X1 should not be less than 2.5% below this value (since this is the step size of the coarse calibration adjustment). However, since this is an analogue value, it is wise to allow for double this range in practice. Thus, for a valid fine calibration, X1 is permitted to lie in the range [29709, 31250].

The maximum functional X2 value is given by an estimate of how much the analogue 33/32 ratio may deviate from ideal. To be on the safe side this is doubled (i.e. 34/32), which gives a maximum permitted value for X2 of 31250*34/32=33203. Thus X2 is permitted to lie in the range [31250, 33203].

To ensure that there is no chance of overflow, 16-bit counters are used for X1 and X2.

The calculation comprises two subtractions and one division (since the multiplication by 1024 is simply a 10-bit left-shift). The division is the costly part and is done serially. Care is taken to avoid truncation in the calculation, which might otherwise lead to additional frequency offset of the clock. A dedicated part of the calibration engine 33 carries out the calculation. The output value N is passed to the control circuit 32 for the RC oscillator.

The RC oscillator is controlled so that the average frequency over a 1024 period span will be within +/−100 ppm of 32 KiHz. The RC oscillator will run at frequency f1 (1/T1) for 1024-minus-N periods and at frequency f2 (1/T2) for N periods. When the output rcoscCal is high, the frequency of the RC-oscillator is reduced by approximately 1/33.

To minimize timing variations, the cycles at f1 and f2 are interleaved by the calibration engine 33. A 10-bit input signal specifies for how many cycles N in a 1024 cycle interval rcoscCal should be high. To obtain uniform spreading of high frequency (rcoscCal=0) and low frequency (rcoscCal=1) cycles, a first-order sigma-delta circuit is used.

Figure 6:
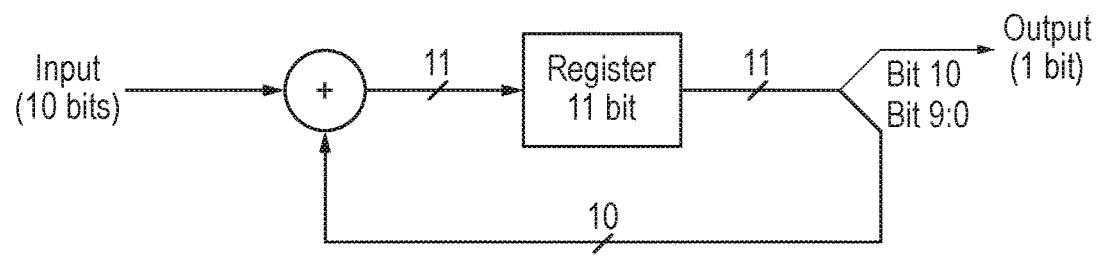
FIG. 6 is a diagram of sigma-delta circuit, used to determine a switching pattern for the oscillator.

FIG. 6 shows the sigma-delta circuit in schematic form. It consists of a 10-bit adder leading to an 11-bit register. The input value N enters the adder, where it is added to feedback from the register output. This 10-bit feedback value comprises all but the most-significant bit of output from the register. Mathematically, the circuit calculates incremental multiples of the input value, modulo 1024. The most significant bit of the register's output determines rcoscCal, which will be 1 every time a multiple of the input value is reduced mod 1024.

The resolution of the fine calibration is directly dependent on the capacitor ratio (C2/C1), and the number of pulses $N_T$ in the calibration interval (i.e. 1024 in this example). The smallest step achievable is that one 32 KiHz period is lengthened by 1/32 period over the entire calibration interval. This implies a resolution in frequency of $$(1/N_T)*(C2-C1)/C1=(1/1024)*(1/32)=+/-15 \text{ ppm}.$$

The calibration engine 33 is directly controlled from the calibration interval timer 31. To start up calibration it receives two signals: startCalib and enableCalib. The startCalib is a short pulse (one RC oscillator period) used to initiate the calibration. The enableCalib signal is held high during the entire calibration. The enableCalib signal can thus be used to interrupt calibration (normally when the calibration is finished and valid but also in the case that pwru-pRcosc goes low) and perform a safe shutdown.

The calibration engine 33 is a fully synchronous design, except for the osc32Ki signal from the analog RC-oscillator and startCalib and enableCalib signals from the calibration interval timer 31, which are synchronised before use. To improve accuracy in calibration, the synchronisation circuit is also used to detect a positive edge on rcoscIn before RC-oscillator pulse counting is started.

The combined clock de-bouncer and divide-by-4 circuit 34 ensures that the crystal-oscillator clock has reached stable amplitude and frequency before it is used in the other modules in the design. To ensure this, the de-bouncer counts 16 MHz pulses for 500 microseconds before the clock is let through. The divide-by-4 part of the circuit 34 generates a 4 MHz clock for use in the calibration engine 33. This can be implemented by clock gating (only every fourth pulse is let through), so that the output does not have 50% duty cycle.

The down-converting module 35 is used to generate 32 KiHz from the 16 MHz input clock. Because 16 MHz is not an integer multiple of 32 KiHz, it uses a sigma-delta method that effectively gives a clock with average frequency of 32 KiHz, but with some cycle-to-cycle jitter.

The 32 KiHz signal generated from the external 16 MHz crystal 11 is used instead of the RC oscillator output when the RC oscillator needs recalibrating and during a calibration operation.

Figure 7:
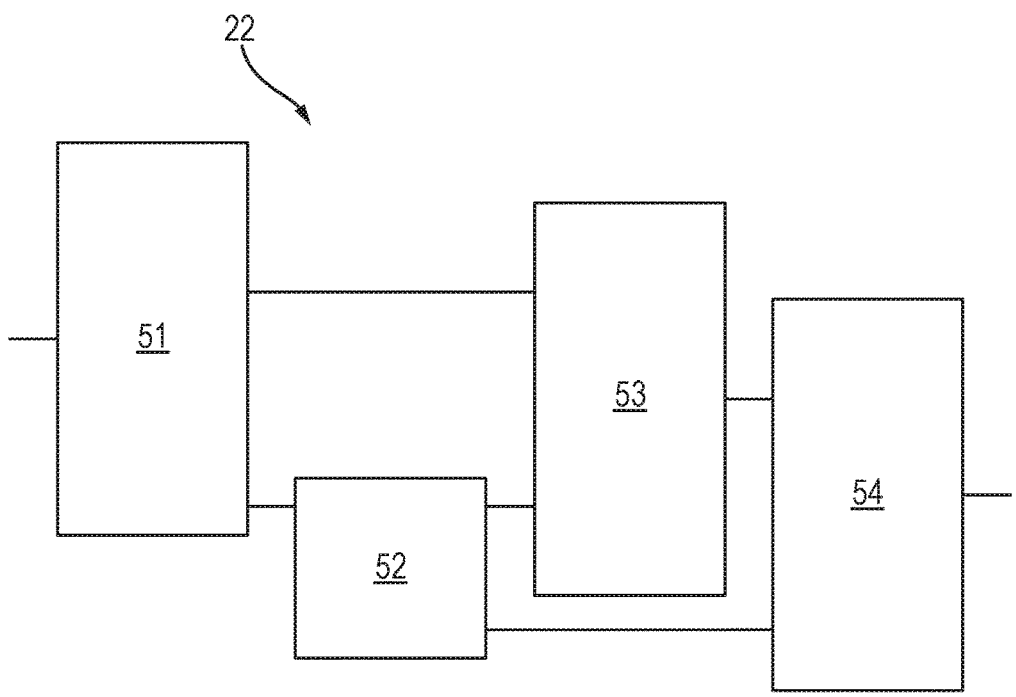
FIG. 7 is a diagrammatic representation of analogue components of the circuit.

FIG. 7 shows major components of the analogue part 22 of the oscillator circuit 1. These comprise a programmable current and voltage generator 51, a charge pump 52, a comparator 53, and a digital control module 54.

The digital control module 54 contains an SR latch, etc. and outputs the final clock signal. The charge pump 52 receives an accurate reference current from the current and voltage generator 51, while an accurate reference voltage is provided to the comparator 53. A digital input to the current generator 51 can be used to adjust the current in steps of at most 2.5% of the nominal frequency, for the purposes of coarse calibration.

Figure 8:
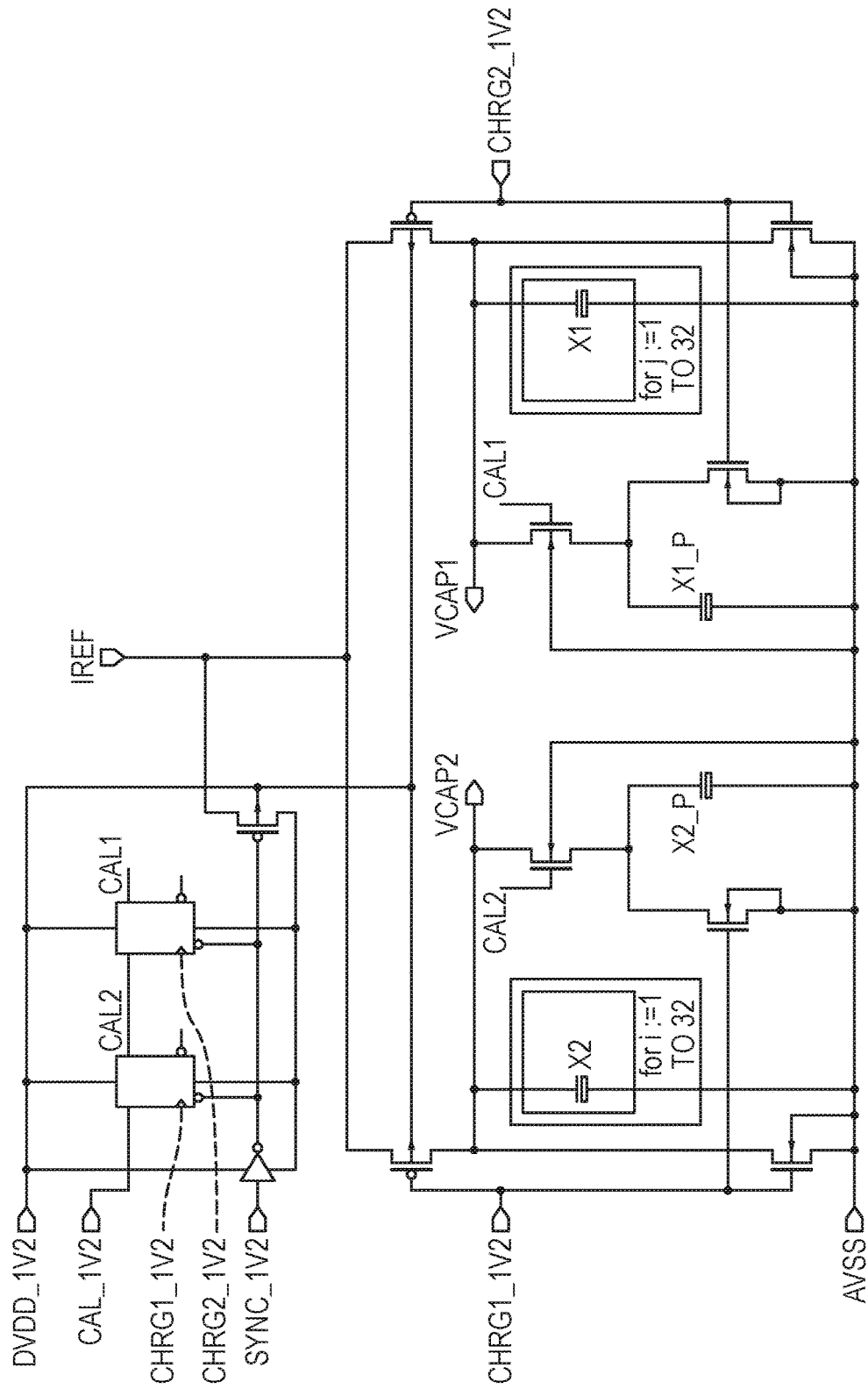
FIG. 8 is a circuit diagram of a charge pump within the analogue circuit.

FIG. 8 shows the charge pump 52 circuit in detail. It is formed in two halves, each operating in a respective half period of the clock. This is controlled by the CHRG1_1V2 and CHRG2_1V2 inputs. The CAL1_1V2 input selects between the lower and higher frequencies; i.e. between $32*C_{unit}$ (CAL=0) and $33*C_{unit}$ (CAL=1), by switching additional capacitors X2_P and X1_P into or out of the circuit. Two D-type flip-flops ensures that switching of capacitors by means of the CAL_1V2 input is performed synchronously with the oscillator signal. There is also a SYNC_1V2 input which will stop the oscillation when SYNC1_1V2 is high, and restart the oscillator immediately with correct phase when it goes low.

Figure 9:
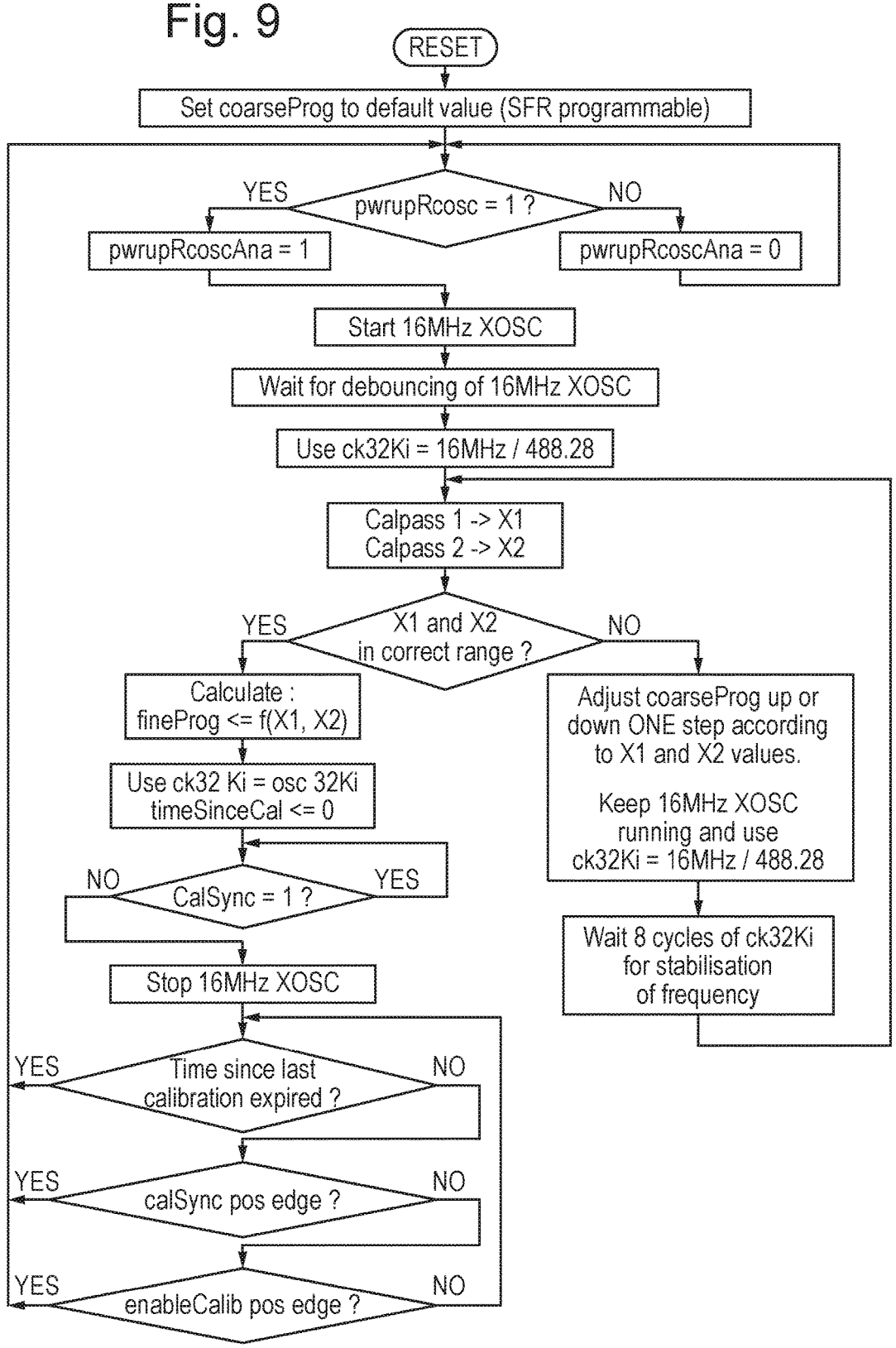
FIG. 9 is a flow chart for the calibration function.

FIG. 9 shows, by way of a flow chart, some of the main steps in the calibration process for the oscillator circuit 1. Calibration is performed in response to a signal indicating a temperature change has occurred, and may also be performed after a reset, or when a defined period of time has elapsed since the last calibration, or when the 16 MHz crystal oscillator 11 is started up (calSync high). If X1 and X2 are determined to be outside their correct ranges, a coarse calibration is performed, until they are within their ranges. A fine calibration is then performed to determine a value fineProg that controls the ratio of high- to low-frequency oscillations.

During the calibration operations, the output from the oscillator is derived from the external crystal oscillator 11.

Thus, an accurate RC-based oscillator circuit has been described which is calibrated optimally only when required because of a change in temperature or a change to a temperature not previously calibrated for. Although the circuit has been described with reference to a 32 KiHz output frequency, it will be understood that any desired output frequency is possible.

The invention claimed is:

1. A method of calibrating a first oscillator, comprising:
measuring a temperature to obtain a measured temperature value;
determining whether said measured temperature value differs from at least one previously measured temperature value by more than a threshold amount; and if said measured temperature does differ from said at least one previously measured temperature by more than said threshold amount, using at least one of a plurality of reference oscillators to calibrate the first oscillator.

2. A method as claimed in claim 1 wherein the at least one previously measured temperature value is stored in a memory.

3. A method as claimed in claim 2 comprising storing multiple previously measured temperature values in the memory and comparing said multiple previously measured temperature values against a subsequent temperature measurement.

4. A method as claimed in claim 2, wherein each temperature value in the memory has an associated calibration result.

5. A method as claimed in claim 2, comprising adding the measured temperature value and a corresponding calibration result to the memory when a new calibration is carried out.

6. A method as claimed in claim 2, wherein the memory comprises a plurality of data sets of temperature values and associated calibration results, and wherein each set of the plurality of data sets corresponds to a different reference oscillator.

7. The method of calibrating a first oscillator as claimed in claim 1, comprising preferentially using a reference oscillator that is already running as said at least one reference oscillator.

8. Apparatus comprising:
a first oscillator;
a plurality of reference oscillators;
a temperature sensing arrangement;
a calibration arrangement for calibrating said first oscillator;
a memory for storing at least one previously measured temperature value;
wherein the apparatus is arranged to determine whether a temperature value measured by said temperature sensing arrangement differs from said at least one previously measured temperature value by more than a threshold amount and if said measured temperature does differ from said at least one previously measured temperature by more than said threshold amount, to use at least one of said plurality of reference oscillators to calibrate said first oscillator.

9. Apparatus as claimed in claim 8, further arranged to issue a request to power up the reference oscillator when it is required to calibrate the first oscillator.

10. Apparatus as claimed in claim 8, wherein the at least one previously measured temperature value comprises a temperature measured when the first oscillator was most recently calibrated.

11. Apparatus as claimed in claim 8, further arranged to calibrate the first oscillator periodically.

12. Apparatus as claimed in claim 8, further arranged to measure the temperature at regular intervals.

13. Apparatus as claimed in claim 8, wherein first oscillator is an RC oscillator.

14. Apparatus as claimed in claim 8, wherein the reference oscillator is an RC oscillator having a higher frequency than the first oscillator, or a crystal oscillator.

15. Apparatus as claimed in claim 8, wherein the at least one previously measured temperature value is stored in the memory.

16. Apparatus as claimed in claim 15, further arranged to store multiple previously measured temperature values in the memory and to compare said multiple previously measured temperature values against a subsequent temperature measurement.

17. Apparatus as claimed in claim 15, wherein each temperature value in the memory has an associated calibration result.

18. Apparatus as claimed in claim 15, further arranged to add the measured temperature value and a corresponding calibration result to the memory when a new calibration is carried out.

19. Apparatus as claimed in claim 15, wherein the memory comprises a plurality of data sets of temperature values and associated calibration results, and wherein each set of the plurality of data sets corresponds to a different reference oscillator.

20. An apparatus as claimed in claim 8, wherein some or all of the apparatus is provided on a common integrated circuit.

21. An apparatus as claimed in claim 20, wherein the reference oscillator is external to the common integrated circuit.

22. An apparatus as claimed in claim 20, wherein the temperature sensing arrangement is external to the common integrated circuit.

23. The apparatus as claimed in claim 8 arranged preferentially to use a reference oscillator that is already running as said at least one reference oscillator.

24. An integrated circuit, comprising:
a first oscillator;
a calibration arrangement for calibrating said first oscillator;
a memory for storing at least one previously measured temperature value; and
at least one of the following features or combinations of features:
i) a temperature sensing arrangement; and an input for receiving a signal from at least one of a plurality of reference oscillators;
ii) a plurality of reference oscillators, and an input for receiving a signal from a temperature sensing arrangement; and
iii) an input for receiving a signal from at least one of a plurality of reference oscillators and an input for receiving a signal from a temperature sensing arrangement;
wherein the integrated circuit is arranged to determine whether a temperature value measured by said temperature sensing arrangement differs from said at least one previously measured temperature value by more than a threshold amount and if said measured temperature does differ from said at least one previously measured temperature, by more than said threshold amount, to use at least one of said plurality of reference oscillator, or said signal received from at least one of the plurality of reference oscillators, to calibrate said first oscillator.

25. A non-transitory computer readable medium comprising software, which when run on a suitable processor configures the processor to calibrate a first oscillator by carrying out the steps of:
receiving a measured temperature value;
determining whether said measured temperature value differs from at least one previously measured temperature value by more than a threshold amount; and if said measured temperature does differ from said at least one previously measured temperature, using at least one of a plurality of reference oscillators to calibrate the first oscillator.

26. A non-transitory computer readable medium as claimed in claim 25, wherein the at least one previously measured temperature value is stored in a memory.

27. A non-transitory computer readable medium as claimed in claim 26, wherein the software further configures the processor to store multiple previously measured temperature values in the memory and to compare said multiple previously measured temperature values against a subsequent temperature measurement.

28. A non-transitory computer readable medium as claimed in claim 26, wherein each temperature value in the memory has an associated calibration result.

29. A non-transitory computer readable medium as claimed in claim 26, wherein the software further configures the processor to add the measured temperature value and a corresponding calibration result to the memory when a new calibration is carried out.

30. A non-transitory computer readable medium as claimed in claim 26, wherein the memory comprises a plurality of data sets of temperature values and associated calibration results, and wherein each set of the plurality of data sets corresponds to each of the plurality of reference oscillators.

\* \* \* \* \*